United States Patent [19]

Ushirogouchi et al.

[11] Patent Number: 5,348,838

[45] Date of Patent: Sep. 20, 1994

[54] PHOTOSENSITIVE COMPOSITION COMPRISING ALKALI SOLUBLE BINDER AND PHOTOACID GENERATOR HAVING SULFONYL GROUP

[75] Inventors: Toru Ushirogouchi, Yokohama; Naoko Kihara, Matsudo; Osamu Sasaki, Sagamihara; Tsukasa Tada; Takuya Naito, both of Tokyo; Satoshi Saito, Yokohama, all of Japan

[73] Assignee: Kabushiki Kaisha Toshiba, Kawasaki, Japan

[21] Appl. No.: 921,692

[22] Filed: Jul. 30, 1992

[30] Foreign Application Priority Data

Jul. 31, 1991 [JP] Japan ................................. 3-213198
Mar. 12, 1992 [JP] Japan ................................. 4-053729

[51] Int. Cl.$^5$ ............................................. G03C 1/492
[52] U.S. Cl. ................................. 430/270; 430/325; 430/326; 430/909
[58] Field of Search ............... 430/270, 325, 326, 909; 522/109, 110, 146

[56] References Cited

U.S. PATENT DOCUMENTS

| | | | |
|---|---|---|---|
| 3,850,734 | 11/1974 | Parekh | 427/409 |
| 4,371,605 | 2/1983 | Renner | 522/50 |
| 4,603,101 | 7/1986 | Crivello | 430/270 |
| 4,618,564 | 10/1986 | Demmer et al. | 430/920 |
| 4,857,437 | 8/1989 | Banks et al. | 430/327 |
| 5,110,709 | 5/1992 | Aoai et al. | 430/271 |

FOREIGN PATENT DOCUMENTS 63-327829 2/1988 Japan .
3223866 10/1991 Japan .

OTHER PUBLICATIONS

Nitrobenzyleester Chemistry for Polymer Processes Involving Chemical Amplification Macromolecules, 21,2001 (1988). F. H. Houlihan, et al. pp. 2001–2006.

*Primary Examiner*—John Kight, III
*Assistant Examiner*—Rachel Johnson
*Attorney, Agent, or Firm*—Oblon, Spivak, McClelland, Maier & Neustadt

[57] ABSTRACT

A photosensitive composition comprises an alkali-soluble resin, a compound which has a substituent group decomposable by an acid and generates an alkali-soluble group upon decomposition of the substituent group, or a compound which has a substituent group capable of crosslinking the alkali-soluble resin in the presence of an acid, and a compound which generates an acid upon exposure, which is represented by formula (1) given below:

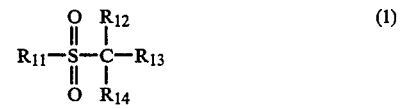

wherein $R_{11}$ represents a monovalent organic group or a monovalent organic group into which at least one selected from the group consisting of a halogen atom, a nitro group, and a cyano group is introduced, each of $R_{12}$, $R_{13}$, and $R_{14}$ independently represents hydrogen, a halogen atom, a nitro group, a cyano group, a monovalent organic group, or a monovalent organic group into which at least one selected from the group consisting of a halogen atom, a nitro group, and a cyano group is introduced.

32 Claims, No Drawings

PHOTOSENSITIVE COMPOSITION COMPRISING ALKALI SOLUBLE BINDER AND PHOTOACID GENERATOR HAVING SULFONYL GROUP

BACKGROUND OF THE INVENTION

1. Field of the Invention

The present invention relates to a photosensitive composition used as a resist material.

2. Description of the Related Art

Photoresists are used widely in the field of electronic components requiring various micropatterning operations, as in the field of semiconductors integrated circuits such as LSIs. In particular, in order to achieve a high degree of integration along with developments of multifunctional, and high-density electronic devices, forming fine resist patterns has been required. As one method for forming a fine resist pattern, a radiation source for emitting light having a short wavelength is used. For example, it has been attempted to use a KrF excimer laser (wavelength: 248 nm) as a radiation source or to apply exposure to an ionizing radiation such as an electron beam or X-ray so as to form a fine resist pattern. Accordingly, strong demand has arisen for developing a resist material having a high sensitivity and a high resolution in the case of applying the above light source and a high resistance to etching for forming a fine pattern.

A so-called chemical amplification type resist is disclosed in Published Unexamined Japanese Patent Application No. 63-27829 as a resist material having a high sensitivity for the excimer laser, an ultraviolet ray having a short wavelength, and the ionic radiation and a sufficiently high resistance to dry etching for forming a fine pattern. This chemical amplification type resist is a composition containing an alkali-soluble resin, a dissolution inhibitor, and an arylonium salt as an acid generator. The dissolution inhibitor in this composition reduces solubility of the alkali-soluble resin in the alkaline solution at a nonexposed portion, and the arylonium salt generates an acid at an exposed portion. In addition, baking is performed to cause the acid to decompose the dissolution inhibitor, and only the exposed portion is dissolved in an alkaline solution (i.e., a developing solution), thus obtaining a positive resist pattern. In the resist containing the acid generator, however, when the content of the acid generator is excessive, or the baking temperature performed upon exposure is excessively high, or the baking time is excessively long, this resist does not serve as a high-sensitivity positive resist material. In this composition, the acid generated from the acid generator quickly loses its activity during a period from the end of exposure to the start of baking. For this reason, this composition cannot be stable resist during process for forming a resist pattern.

SUMMARY OF THE INVENTION

The present invention has been made in consideration of the conventional problems described above, and has as its object to provide a photosensitive composition suitable as a resist material having a high sensitivity and a high resolution for an ultraviolet ray having a short wavelength, an ionizing radiation, and the like and high stability throughout a pattern formation process.

The above object will be achieved by a photosensitive composition according to any one of the following first, second, and third embodiments of the present invention.

The photosensitive composition according to the first embodiment of the present invention comprises an alkali-soluble resin, a compound which has a substituent group decomposable by an acid and generates an alkali-soluble group upon decomposition of the substituent group, or a compound which has a substituent group capable of crosslinking the alkali-soluble resin in the presence of an acid, and a compound which generates an acid upon exposure, which is represented by formula (1) given below:

wherein $R_{11}$ represents a monovalent organic group or a monovalent organic group into which at least one selected from the group consisting of a halogen atom, a nitro group, and a cyano group is introduced, each of $R_{12}$, $R_{13}$, and $R_{14}$ independently represents hydrogen, a halogen atom, a nitro group, a cyano group, a monovalent organic group, or a monovalent organic group into which at least one selected from the group consisting of a halogen atom, a nitro group, and a cyano group is introduced.

The photosensitive composition according to the second embodiment of the present invention comprises an alkali-soluble resin, a compound which has a substituent group decomposable by an acid and generates an alkali-soluble group upon decomposition of the substituent group, or a compound which has a substituent group capable of crosslinking the alkali-soluble resin in the presence of an acid, and a compound which generates an acid upon exposure, which is represented by formula (2) given below:

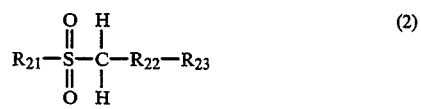

wherein each of $R_{21}$ and $R_{23}$ independently represents a monovalent organic group or a monovalent organic group into which at least one selected from the group consisting of a halogen atom, a nitro group, and a cyano group is introduced, and $R_{22}$ represents a sulfonyl or carbonyl group.

The photosensitive composition according to the third embodiment of the present invention comprises an alkali-soluble resin, a compound which has a substituent group decomposable by an acid and generates an alkali-soluble group upon decomposition of the substituent group, or a compound which has a substituent group capable of crosslinking the alkali-soluble resin in the presence of an acid, and a compound which generates an acid upon exposure, which is represented by formula (3) given below:

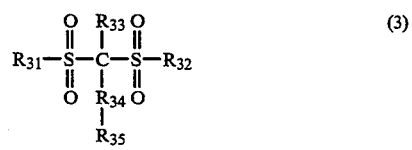

wherein each of $R_{31}$, $R_{32}$, and $R_{35}$ independently represents a monovalent organic group or a monovalent organic group into which at least one selected from the group consisting of a halogen atom, a nitro group, and a cyano group is introduced, $R_{33}$ represents hydrogen, a monovalent organic group, or a monovalent organic group into which at least one selected from the group consisting of a halogen atom, a nitro group, and a cyano group is introduced, and $R_{34}$ represents a sulfonyl group, a sulfinyl group, a sulfur atom, and a carbonyl group.

When the photosensitive composition according to any one of the first, second, and third embodiments is subjected to the pattern formation process including exposure to an ultraviolet ray having a short wavelength or an ionizing radiation, it exhibits a high sensitivity and a high resolution. In addition, the composition of the present invention is stable throughout the process as far as performance is concerned. It is, therefore, possible to faithfully transfer a fine pattern on a substrate or the like. Accordingly, the photosensitive composition according to the present invention can be suitably applied to a photoetching process in the manufacture of a semiconductor device having a high degree of integration.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

DETAILED DESCRIPTION OF THE PREFERRED EMBODIMENT

The photosensitive composition according to any one of the first, second, and third embodiments of the present invention contains three essential components, i.e., an alkali-soluble resin, a compound which has a substituent group decomposable by an acid and generates an alkali-soluble group upon decomposition of the substituent group, or a compound which has a substituent group capable of crosslinking the alkali-soluble resin in the presence of an acid, and a compound which generate an acid upon exposure (to be referred to as an acid generator hereinafter).

When the photosensitive composition contains a compound having a substituent group decomposable by an acid, a resin component is insoluble in an alkali solution by the behavior of this compound (the substituent group) in a nonexposed state. Once the composition is exposed to light and subjected to baking, an acid is generated from the acid generator, and the above compound is decomposed by the acid to generate an alkali-soluble group. As a result, the resin component at an exposed portion of the photosensitive composition becomes soluble in the alkali solution.

On the other hand, when the photosensitive composition contains a compound having a substituent group capable of crosslinking the alkali-soluble resin in the presence of an acid, the resin component is soluble in the alkali solution in a nonexposed state. Once the composition is exposed to light and subjected to baking, an acid is generated from the acid generator, and the above compound crosslinks the resin component by the behavior of the acid generated. As a result, the resin component at the exposed portion of the photosensitive composition becomes soluble in the alkali solution.

The acid generator of the components in each of the compositions according to the first, second, and third embodiments of the present invention is a compound which is able to generate an acid upon exposure to light, i.e., an ultraviolet ray having a short wavelength, an electron beam, an X-ray, or the like. The present invention is characterized in that a compound containing a sulfonyl group, which is represented by each of formulas (1) to (3) given above is used as the acid generator.

In the composition according to the first embodiment of the present invention, the compound (1) used as the acid generator is an organic compound containing one sulfonyl group.

Examples of the monovalent organic groups introduced into the compound (1) as $R_{11}$, $R_{12}$, $R_{13}$, and $R_{14}$ are allyl, anisyl, anthraquinolyl, acetonaphthyl, anthryl, azulenyl, benzofuranyl, benzoquinolyl, benzoxazinyl, benzoxazolyl, benzyl group, biphenylenyl, bornyl, butenyl, butyl, cinnamyl, cresotoyl, cumenyl, cyclobutanedienyl, cyclobutenyl, cyclobutyl, cyclopentadienyl, cyclopentatolyenyl, cycloheptyl, cyclohexenyl, cyclopentyl, cyclopropyl, cyclopropenyl, decyl, dimethoxyphenetyl, diphenylmethyl, docosyl, dodecyl, eicosyl, ethyl, fluorenyl, furfuryl, geranyl, heptyl, hexadecyl, hexyl, hydroxymethyl, indanyl, isobutyl, isopropyl, isopropylbenzyl, isoquiazolyl, menthyl, mesityl, methoxybenzyl, methoxyphenyl, methyl, methylbenzyl, naphthyl, naphthylmethyl, nonyl, norbonyl, octacosyl, octyl, oxazinyl, oxazolydinyl, oxazolynyl, oxazolyl, pentyl, phenacyl, phenansulyl, phenethyl, phenyl, phthalydyl, propynyl, propyl, pyranyl, pyridyl, quinazonyl, quinolyl, salicyl, terephthalyl, tetrazolyl, thiazolyl, thiaphthenyl, thienyl, tolyl, trityl, trimethylsilylmethyl, trimethylsilyloxymethyl, undecyl, valeryl, veratyl, and xylyl. Of all the above groups, a group in which a halogen atom, a nitro group, or a cyano group is substituted for the hydrogen atom can be used as the monovalent organic group into which at least one selected from the group consisting of a halogen atom, a nitro group, and a cyano group is introduced.

Examples of the compound (1) are phenylmethylsulfone, ethylphenylsulfone, phenylpropylsulfone, methylbenzylsulfone, benzylsulfone (dibenzylsulfone), methylsulfone, ethylsulfone, butylsulfone, methylethylsulfone, methylsulfonylacetonitrile, phenylsulfonylacetonitrile, toluenesulfonylacetonitrile, benzylphenylsulfone, nitrophenylsulfonylacetonitrile, fluorophenylsulfonylacetonitrile, chlorophenylsulfonylacetonitrile, methoxyphenylsulfonylacetonitrile, α-methylphenylsulfonylacetonitrile, ethylsufonylacetonitrile, methythiomethyl-p-toluylsulfone, phenylsulfonylacetophenone, phenylsulfonylpropionitrile, phenylsulfonylpropionic acid and an ester compound thereof, bromomethyl-2-(phenylsulfonylmethyl)benzene, naphthylmethylsulfone, 1-methyl-2-((phenylsulfonyl)methyl)benzene, and trimethyl-3-(phenylsulfonyl)orthopropionate.

According to the present invention, the compound (1) having an electron withdrawing group as at least one of $R_{12}$, $R_{13}$, and $R_{14}$, particulary having a cyano group or a nitro group as such, is preferable since they have high efficiency of an acid generation during exposure and increases the sensitivity of the photosensitive composition (resist). The compound containing a hydrogen atom as at least one of $R_{12}$, $R_{13}$, and $R_{14}$ has a high alkali solubility. when development using an alkaline solution for a resist is employed, this compound is preferable to suppress production of scums.

In the compound (1), $R_{11}$ and $R_{12}$, $R_{13}$, or $R_{14}$ may be combined to form a ring, or $R_{12}$, $R_{13}$, and $R_{14}$ may be combined to form a ring. In this case, examples of a derived cyclic compound are phenylsulfonytetrahydropyran, phenylsulfonylcyclohexane, a thiopyrandioxide compound (e.g., 3-phenyl 2H-thiopyran 1,1-dioxide, and 6-methyl-3-phenyl 2H-thiopyran 1,1-dioxide), trimethylenesulfone, tetramethylenesulfone, a biscyclictrisulfone compound (e.g., 4-methyl-2,6,7-trithiabicyclo[2,2,2]-octane-2,2,6,6,7,7-hexaoxide), and the following compounds.

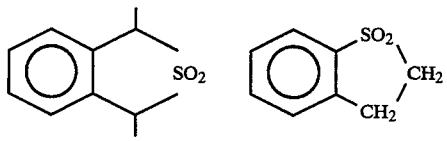

The compound (2) used as the acid generator in the composition according to the second embodiment of the present invention is an organic compound in which two sulfonyl groups, or one sulfonyl group and one carbonyl group are bonded to a specific carbon atom. Monovalent organic groups introduced as $R_{21}$ and $R_{23}$ in the compound (2) are the same groups exemplified as monovalent organic groups introduced in the compound (1). At least one selected from the group consisting of a halogen atom, a nitro group, and a cyano group may be substituted for the hydrogen atom in each of these organic groups.

Examples of the compound (2) are bis(phenylsulfonyl)methane, bis(methylsulfonyl)methane, bis(ethylsulfonyl)methane, (methylsulfonyl)(phenylsulfonyl)methane, phenylsulfonylacetophenone, and methylsulfonylacetophenone.

According to the present invention, the compound (2) is preferable since it has high alkali solubility and high efficiency of an acid generation during exposure to increase the sensitivity of the photosensitive composition (resist).

In the compound (2), $R_{21}$ and $R_{23}$ may be combined to form a ring. A derived cyclic compound can be exemplified by the following cyclic sulfone compounds:

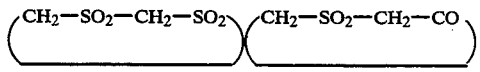

The compound (3) used as the acid generator in the composition according to the third embodiment of the present invention is an organic compound in which at least two sulfonyl groups and a linking group containing sulfer or one carbonyl group is bonded to the specific carbon atom. The monovalent organic groups introduced as $R_{31}$, $R_{32}$, $R_{33}$, and $R_{35}$ in the compound (3) are exemplified as the same monovalent organic groups introduced in the compound (1). In addition, at least one selected from the group consisting of a halogen atom, a carboxyl group, a cyano group, a hydroxyl group, a carboxyl group, or an esterified carboxyl group may be substituted for the hydrogen atom of these organic groups. $R_{34}$ preferably represents a sulfonyl group, a sulfinyl group, or a sulfur atom.

Examples of the compound (3) are tris(phenylsulfonyl)methane, phenylthio-bis(phenylsulfonyl)-methane, phenylmercapto-bis(methylsulfonyl)-methane, tris(methylsulfonyl)methane, tris(ethylsulfonyl)methane, bis(phenylsulfonyl)-methylsulfonylmethane, bis(methylsulfonyl)-phenylsulfonyl-methane, phenylsulfonyl-ethylsulfonyl-methylsulfonyl-methane, tris(4-nitrophenylsulfonyl)methane, tris(2,4-nitrophenylsulfonyl)methane, bis(phenylsulfonyl)-(4-nitrophenylsulfonyl)-methane, bis(phenylsulfonyl)-(3-nitrophenylsulfonyl)-methane, bis(phenylsulfonyl)-(2-nitrophenylsulfonyl)-methane, bis(phenylsulfonyl)-(p-tolylsulfonyl)-methane, bis(methysulfonyl)-(4-nitrophenylsulfonyl)-methane, bis(methysulfonyl)-(4-chlorophenylsulfonyl)-methane, bis(phenylsulfonyl)-(4-fluorophenylsulfone)-methane and 1,1,1,-tris(phenylsulfonyl)ethane.

According to the present invention, when the photosensitive composition is subjected to exposure to a KrF excimer laser light, the compound (1), (2), or (3) having an aromatic group as $R_{11}$, at least one of $R_{21}$ and $R_{23}$, or at least one of $R_{31}$, $R_{32}$, and $R_{35}$ is preferable to improve resistance to dry etching and heat resistance of the composition. In addition, an acid generator having a melting point of 50° C. or more and high solubility in an organic solvent is also preferable.

When the compound (1), (2), or (3) is a sulfonyl compound (e.g., sulfonamide) containing a basic substituent group, an acid generated upon exposure loses its activity in same cases. When the compound (1), (2), or (3) is a sulfonyl compound which contains an acidic group having high alkali solubility such as sulfonic acid, the alkali solubility of the nonexposed portion of the photosensitive composition may be excessively increased. For this reason, use of the kinds of the sulfonyl compounds as the acid generators in the compositions of the present invention may be strictly limited.

The content of an acid generator in a photosensitive composition of the present invention, i.e., the content of the compound (1) in the composition according to the first embodiment, the content of the compound (2) in the composition according to the second embodiment, or the content of the compound (3) the composition according to the third embodiment is at least about 0.1 part by weight and less than about 40 parts by weight based on 100 parts by weight of an alkali-soluble resin. If the content is less than 0.1 parts by weight, the sensitivity of the photosensitive composition tends to decrease. However, if the content exceeds 40 parts by weight or more, film forming properties of the photosensitive composition tend to be degraded, and the dissolution rate of the photosensitive composition in the developing solution tends to greatly decrease. Most preferably, the content of the acid generator falls within the range of 2 to 10 parts by weight based on 100 parts by weight of the alkali-soluble resin.

The alkali-soluble resin corresponding to the resin component of the photosensitive composition according to the present invention will be described below. Note that an alkali-soluble resin used in the present invention is common to photosensitive compositions according to the first, second, and third embodiments.

A polymer having a phenol skeleton is generally used as the alkali-soluble resin. For example, this polymer is exemplified by: phenolic novolak resin, cresylic novolak resin, xylenol-novolak resin, vinylphenol resin, and isopropenylphenol resin; a copolymer of vinylphenol and at least one component selected from the group consisting of an acrylic or methacrylic derivative, acrylonitrile, or a styrene derivative; and a copolymer of isopropenylphenol and at least one component selected from the group consisting of an acrylic or methacrylic derivative, acrylonitrile, or a styrene derivative. More specific examples of the above polymer are poly(p-vinylphenol), a copolymer of p-isopropenylphenol and acrylonitrile, a copolymer of p-isopropenylphenol and styrene, a copolymer of p-vinylphenol and methylmethacrylate, and a copolymer of p-vinylphenol and styrene. In addition, a silicon-containing alkali-soluble polymer such as polysiloxane having phenol in a side chain, polysilane having phenol in a side chain, or a novolak resin synthesized from phenol having silicon in a side chain may be used.

In the present invention, the alkali-soluble resin preferably has a softening point of 150° C. or more for forming a fine pattern. In particular, when an electron beam is used as an radiation source, it is more preferable that the alkali-soluble resin has the above softening point and an average molecular weight of 3,000 to 8,000. The reasons are as follows.

When a resin component of a photosensitive composition used as a resist material has a low softening point, an acid generated by an acid generator upon exposure is excessively diffused by baking performed upon the exposure. The excessive diffusion of the acid causes blurring of a latent image on an exposed portion, and the resolution of the resist pattern finally formed may be undesirably decreased in some cases.

When a photosensitive composition containing a compound having a substituent group decomposable by an acid and a resin component having a distribution in the range of high molecular weights is exposed to an ionizing radiation, the crosslinking reaction of the polymer chains of the resin may progress excessively during the exposure and baking performed after this exposure, and the image quality of the resist pattern may be degraded and its sensitivity may be undesirably decreased. In view of this, it is preferable to use an alkali-soluble resin which can satisfy conditions as to the softening point and the molecular weight as described above.

An alkali-soluble resin particularly for use in a resist for an ultraviolet ray having a short wavelength or a resist exhibiting resistance to dry etching preferably has an aromatic ring in a resin skeleton, a dissolution rate of about 0.1 to 500 nm/sec in an alkaline developing solution used (normally, a 2.38 wt % aqueous tetramethylammonium hydroxide solution) and a softening point of 150° C. or more.

Resins similar to the above-listed alkali-soluble resins are exemplified as the alkali-soluble resins which satisfy the above-mentioned conditions as to the softening point and average molecular weight. Specific examples are novolak resins obtained by polycondensation of a phenol derivative with formaldehyde under an acidic condition. Examples of these novolak resins are: polymers each containing phenols cresols, xylenols, ethylphenols, butylphenols, halogenated phenols, naphthols or the like in its skeleton.

Other examples of the alkali-soluble resins are polyhydroxystyrene, melamine-formaldehyde resin, poly-4-hydroxymaleimide, poly-α-methylstyrene, a copolymer of 4-hydroxymaleimide, α-methylstyrene, or vinylphenol and acrylic acid or methacrylic acid, a copolymer of a vinyl-series compound containing an aromatic ring and polyacrylic acid or polymethacrylic acid, and a polyimide precursor (polyamic acid). These resins may be used singly or in the form of a mixture containing at least two resins.

Of all the resins described above, the novolak resin having xylenol in a copolymer composition has solubility in an alkaline solution and heat resistance which are high enough to give a high resolution of a resist pattern to be formed. The novolak resin is particularly preferable as an alkali-soluble resin which satisfies the above conditions as to the softening point and the molecular weight. This novolak resin is exemplified by a resin having a copolymer composition which contains at least two components selected from the group consisting of 2,5-xylenol, 3,5-xylenol, m-cresol, p-cresol, and o-cresol and which contains at least 20 to 60 parts by weight of xylenol. In particular, a novolak resin containing 2,5-xylenol is excellent in alkali-solubility and heat resistance. A novolak resin containing 3,5-xylenol readily interacts with a compound containing a substituent group decomposable by an acid. It is preferable to mix these two novolak resins and use the resultant mixture.

More specifically, a novolak resin having the above copolymer composition preferably has a limited composition so as to satisfy the above conditions with respect to the softening point, the average molecular weight, and the dissolution rate. For example, when 2,5-xylenol is contained in the above copolymer composition, the content of xylenol preferably falls within the range of 20 to 60 parts by weight, the content of m-cresol preferably falls within the range of 30 to 80 parts by weight, and the content of p- and o-cresols preferably fall within the range of 0 to 50 parts by weight. When the copolymer composition contains 3,5-xylenol, the content of xylenol preferably falls within the range of 20 to 50 parts by weight, the content of m-cresol preferably falls within the range of 30 to 80 parts by weight, and the contents of p- and o-cresols preferably fall within the range of 0 to 50 parts by weight.

The novolak resin having the above copolymer composition may have a wide molecular weight distribution. To have a high softening point, however, it would be better for the resin to have a low content of low molecular weight substances, such as residual monomers or dimers, as possible. The resin can have such a sufficiently low content of low molecular weight substances, such as residual monomers or dimers, by removing residual monomers or dimers at a higher degree of reducing pressure and increased temperature during the synthesis of novolak resin or by performing fractional precipitation after polymerization. In the above molecular weight distribution, the high molecular weight component contributes to an increase in softening point, and the low molecular weight component contributes to an increase in resolution of the resultant resist pattern. For this reason, components having the intermediate molecular weights may be adjusted by fractional precipitation to control the total molecular weight distribution of a polymer in accordance with specific properties required for the polymer.

In addition, as the resin component of the photosensitive composition, the novolak resin having the above copolymer composition can be partially or entirely substituted by vinylphenol resin, i.e., the vinylphenol resin can be mixed with the novolak resin, so that transparency to deep-ultraviolet rays can be improved. Examples of this vinylphenol resin are: ordinary polyvinylphenol; partially reduced poly-vinylphenol for improving on transparency, i.e., light transmittance; a polyvinylphenol derivative in which some hydroxyl groups of poly-vinylphenol are protected with methyl, acetyl, butyloxycarbonyl, pyranyl or the like to control its dissolution rate; styrene-substituted poly-vinylphenyl which is prepared by adding styrene or the like to poly-vinylphenol with a platinum catalyst; and a copolymer of vinylphenol and styrene.

A compound (to be referred to as a dissolution inhibitor hereinafter) containing a substituent group decomposable by an acid to generate an alkali-soluble group upon decomposition and contained in the photosensitive composition of the present invention will be described below. Note that the dissolution inhibitor in the present invention is common to compositions according to the first, second, and third embodiments.

Preferably, the dissolution inhibitor can be a compound which has a dissolution inhibition function for the alkali-soluble resin in the nonexposed state, contains the substituent group decomposed in the presence of an acid, and after the decomposition, is converted into a compound which generates —COO— or —SO$_3$— by a behavior of an alkaline solution. As a result, the composition of the present invention exhibits high alkali solubility through a series of processes such as exposure, baking (PEB), and development.

The above dissolution inhibitor is exemplified by a compound represented by formula (4) below:

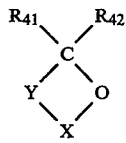

wherein $R_{41}$ and $R_{42}$ may be the same or different and each represents a hydrogen atom, a halogen atom, a cyano group, a nitro group, a sllyl group, or a monovalent organic group. $R_{41}$ and $R_{42}$ may be combined to form a ring. X represents >C=O or —SO$_2$—. Y represents a bivalent organic group. Note that at least one of $R_{41}$, $R_{42}$, and Y has a substituent group decomposable by an acid.

Examples of the monovalent organic group introduced into $R_{41}$ or $R_{42}$ in formula (4) are a substituted or nonsubstituted alkyl group (e.g., methyl, ethyl, propyl, isopropyl, n-butyl, and t-butyl), a substituted or nonsubstituted aromatic group (e.g., phenyl, tolylnaphthyl, anthranyl, and pyrisyl), and a substituted or nonsubstituted allcyclic or heterocyclic group (e.g., cyclohexyl, piperidyl, and pyranyl).

Examples of the bivalent organic group Y introduced into formula (4) are a substituted or nonsubstituted aliphatic group (e.g., ethylene, propylene, and butylene), a group derived from a substituted or nonsubstituted aromatic ring (e.g., benzene, naphthalene, anthracene, phenanthrene, pyridine, and piperidine), and a group derived from a substituted or nonsubstituted alicyclic or heterocyclic group (e.g., cyclohexane, pyrazine, pyran, and morpholane).

Examples of the group decomposable by the acid introduced into at least one of $R_{41}$, $R_{42}$, and Y in formula (4) are esters (e.g., t-butyl ester, isopropyl ester, ethyl ester, methyl ester, and benzyl ester), ethers (e.g., tetrahydropyranyl ether), alkoxycarbonyl groups (e.g., t-butoxycarbonyl (t-butylcarbonate), methoxycarbonyl (methylcarbonate), ethoxycarbonyl (ethylcarbonate)), and silyl ethers (e.g., trimethylsilyl ether, triethylsilyl ether, and triphenylsilyl ether).

Compounds having structures represented by formulas (5) to (7) are preferable as the compound represented by formula (4).

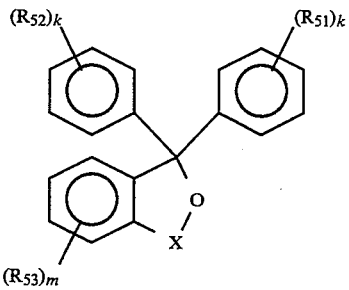

Formula (5)

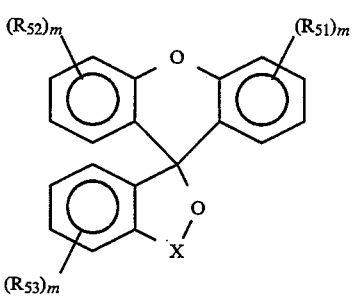

Formula (6)

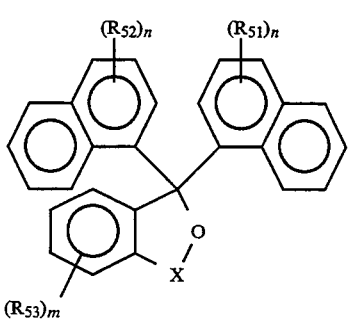

Formula (7)

wherein $R_{51}$, $R_{52}$, and $R_{53}$ in formulas (5) to (7) may be the same or different and each represents a hydrogen atom, a halogen atom, a cyano group, a nitro group, a silyl group, or the monovalent organic group described above. X represents >C=O or —SO$_2$—. Y represents the bivalent organic group described above. k is an integer of 1 to 5, m is an integer of 1 to 4, and n is an integer of 1 to 7. Note that at least one of $RS_{51}$, $R_{52}$, $R_{53}$, and Y has the substituent group decomposable by the acid described above.

Compounds represented by formulas (5), (6) and (7) are derivatives of the following compounds containing hydroxyl groups. Any derivative in which the hydroxyl group is protected by the group decomposable by the acid described above can be used. Examples of the compound containing the hydroxyl group are 3-hydroxy-3-methylphthalide, ascorbic acid, bromocresol green, bromocresol purple, bromocresol blue, bromoxylenol blue, α-chloro-α-hydroxy-o-toluenesulfonic acid-γ-sultone, chlorophenol red, cresol phthalein, Eosin B, Eosin Y, fluorescein, fluorescein isocyanate, phenolphthalein, phenol red, tetrabromophenol blue, 3', 3", 5', 5"-tetrabromophenolphthalein, 4,5,6,7-tetrachlorofluorescein, 3', 3", 5', 5"-tetraiodophenolphthalein, 3', 3", 5', 5"-tetraiodophenolsulfonephthalein, thymolphthalein, naphtholphthalein, and Thymol Blue. At least two molecules of these compounds may be combined through a group having valence of 2 or more to obtain a dimer or trimer compound.

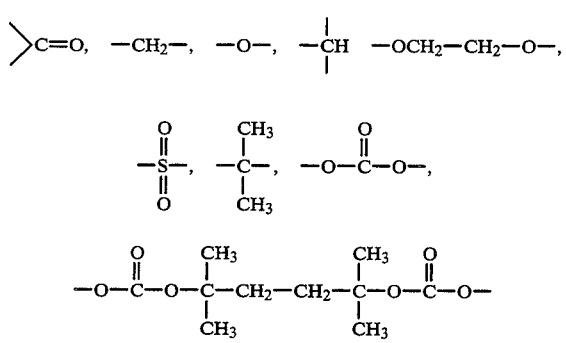

In the photosensitive composition of the present invention, the content of the dissolution inhibitor preferably falls within the range of about 3 to 40 parts by weight based on 100 parts by weight of the alkali-soluble resin due to the following reasons. When the content of the compound is less than 3 parts by weight, the dissolution rate of the nonexposed portion in the composition is increased, and the resolution of the resultant pattern is decreased accordingly. However, when the content of the composition exceeds 40 parts by weight, a resist residue tends to be left.

In the photosensitive composition according to the present invention, when the above-mentioned alkali-soluble resin having a softening point of 150° C. or more and an average molecular weight of about 3,000 to 8,000 is used as the resin component, this resin component is suitably used as a chemical sensitization type. In this case, the type of dissolution inhibitor is not limited to the one described above. That is, if a compound has a substituent group which can inhibit alkali solubility of the resin component during nonexposure and can be decomposed by an acid, and can generate an alkali-soluble group upon decomposition of the substituent group, the dissolution inhibitor is not limited to the compound which has at least one substituent group decomposable by an acid and, after the decomposition, is converted into a compound which generates —COO— or —SO₃—, e.g., the compound represented by formula (4).

Examples of the compound having the substituent group decomposable by the acid, i.e., the dissolution inhibitor are compounds described in U.S. Pat. Nos. 4,491,628 and 4,603,101 and Published Unexamined Japanese Patent Application No. 63-27829, and a compound which contains a carboxylic acid group or phenolic hydroxyl group in its skeleton and in which some or all of hydroxyl terminal positions are substituted with protecting groups which can be decomposed by an acid. Examples of the protecting group are t-butyl ester, t-butoxycarbonyl(t-butylcarbonate), tetrahydropyranyl, and silyl. Practical examples of these compounds will be listed below. In these chemical formulas, m and n represent a polymerization degree of a polymer, or a copolymer composition (weight ratio).

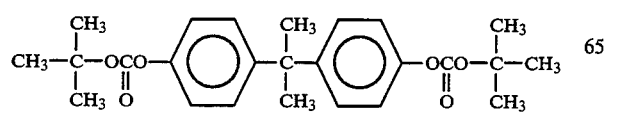

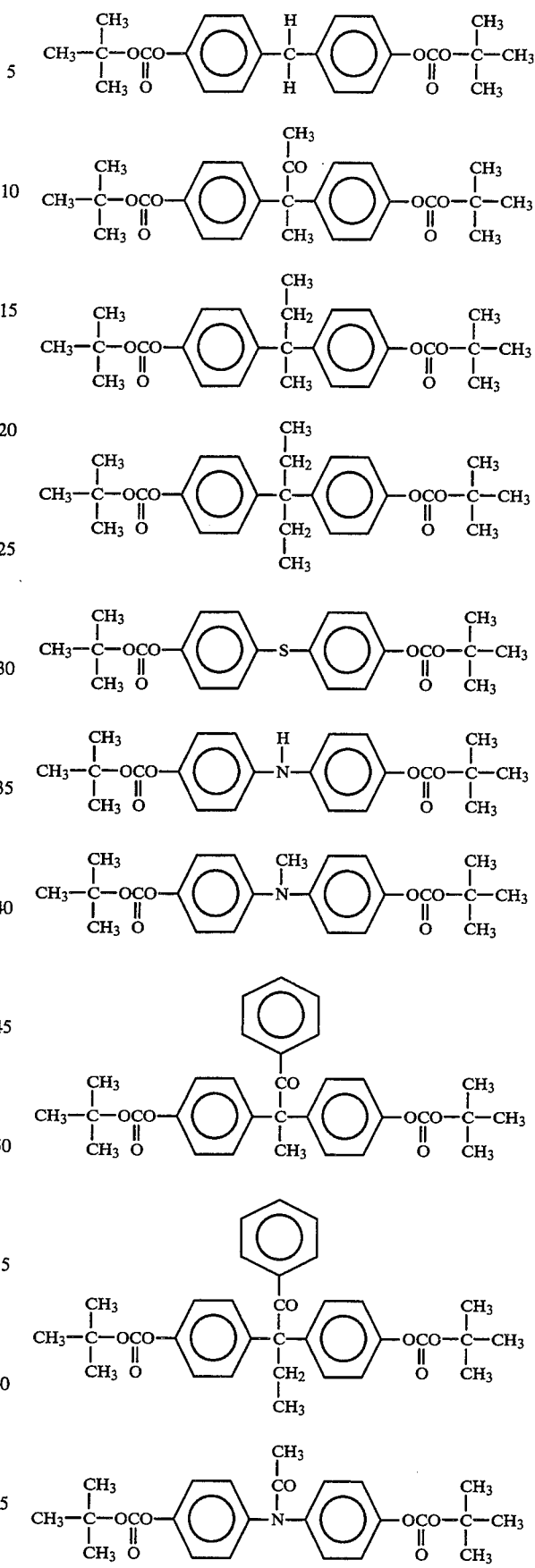

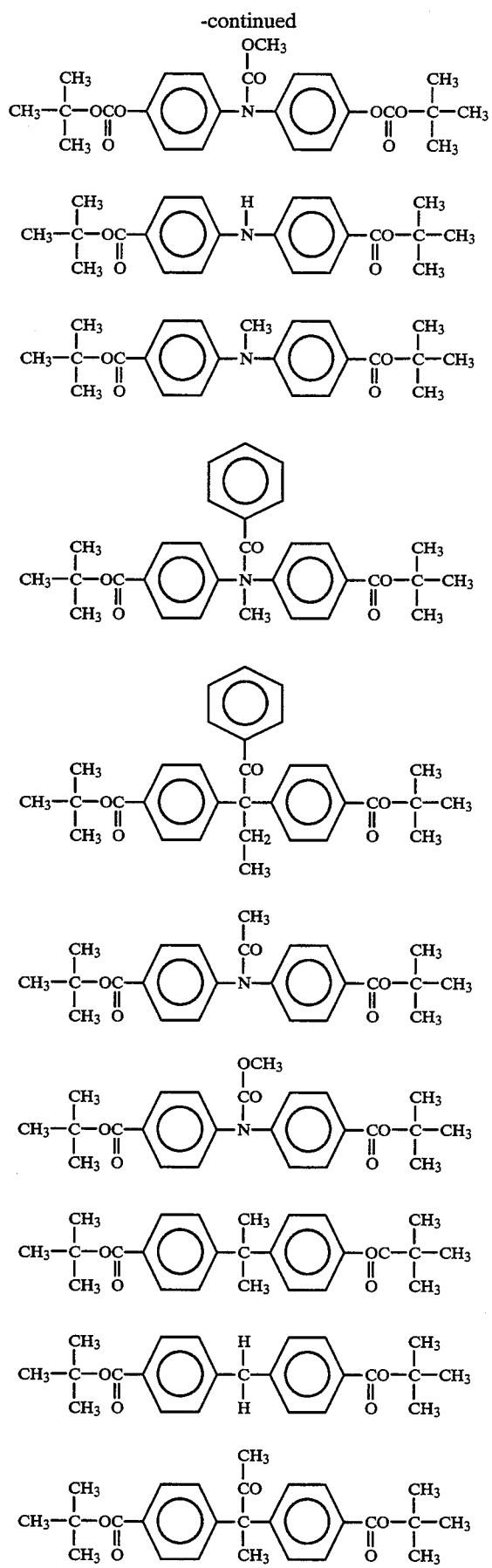
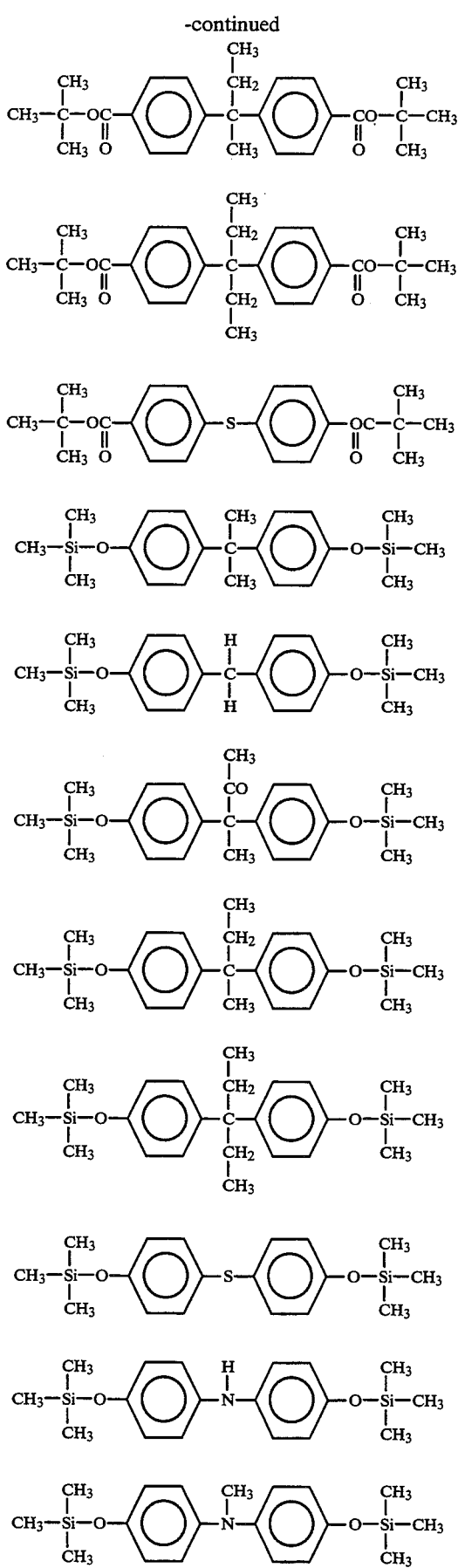

-continued
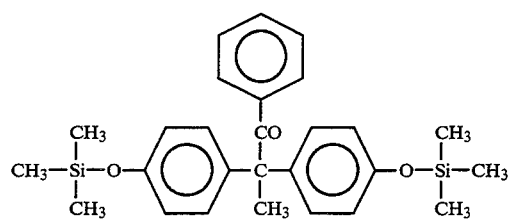
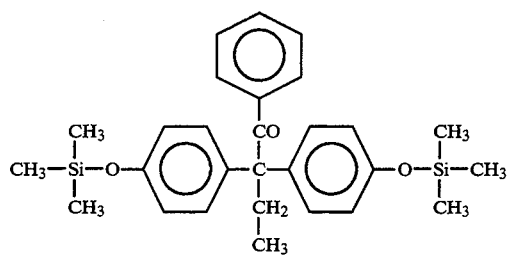
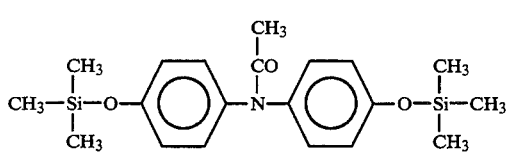
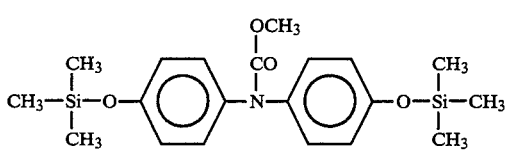
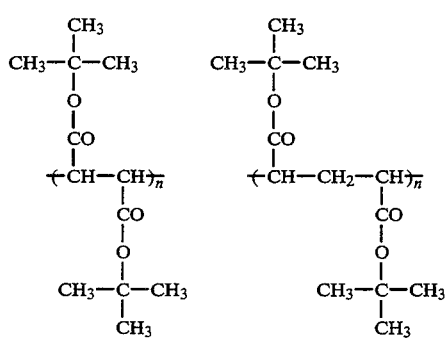
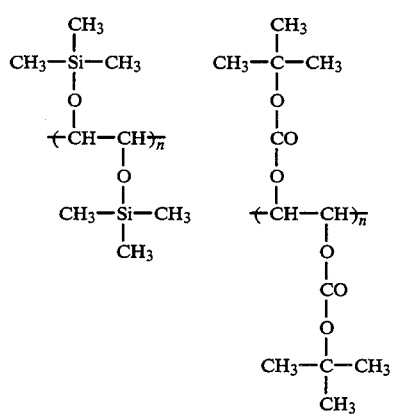
-continued
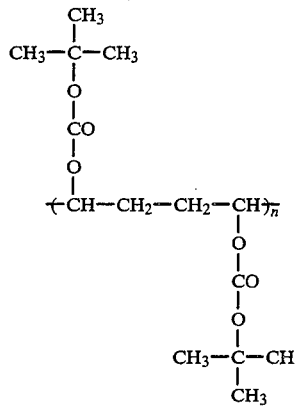
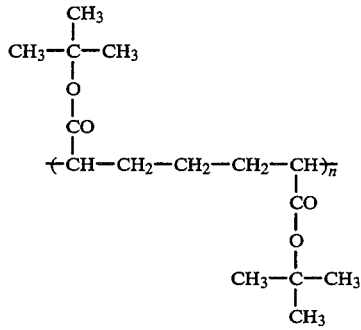
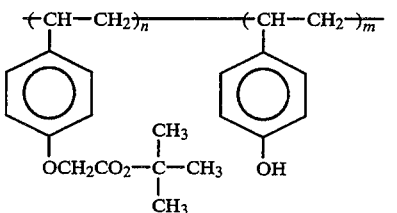
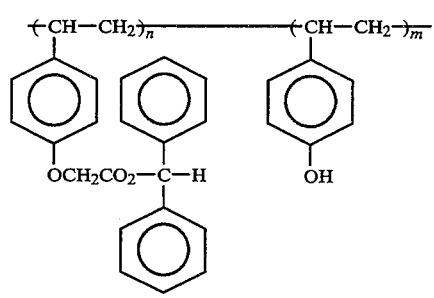
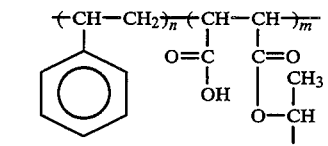
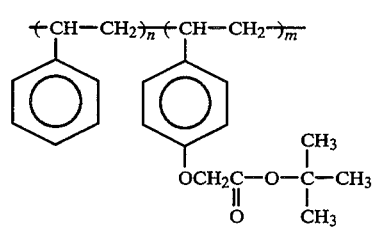

When such a dissolution inhibitor is used in each photosensitive composition according to the present invention, its content is preferably 3 parts by weight or more and less than 40 parts by weight based on 100 parts by weight of the alkali-soluble resin due to the following reasons. When the content of the dissolution inhibitor is less than 3 parts by weight, the resolution of the resultant pattern formed by using the photosensitive composition tends to decrease. However, when the content of the dissolution inhibitor is 40 parts by weight or more, the film formation properties of the photosensitive composition tend to be degraded, and the dissolution rate in the developing solution tends to decrease. Most preferably, the content of the dissolution inhibitor generally falls within the range of 10 to 30 parts by weight based on 100 parts by weight of the alkali-soluble resin. If the dissolution inhibitor consists essentially of an alkali-soluble polymer compound, it can also serve as a resin component, i.e., an alkali-soluble resin in the composition of the present invention. In this case, the content of the compound preferably falls within the range of 10 to 98 parts by weight based on the total amount of the solid component since an amount corresponding to that of the resin is added.

In the photosensitive composition according to the present invention, when the above-mentioned alkali-soluble resin having a softening point of 150° C. or more and an average molecular weight of about 3,000 to 8,000 is used as the resin component, a specific compound like the compound represented by formula (4) is used as the dissolution inhibitor to increase a change in solubility of the resin component in an alkali solution when the composition is baked after exposure to light. Therefore, a combination of the specific alkali-soluble resin and the specific dissolution inhibitor (i.e., the compound having the substituent group decomposable by the acid) as described above is most preferable to improve the resolution of the resultant resist pattern.

A compound having a substituent group capable of crosslinking the alkali-soluble resin in the presence of an acid, which is contained in a photosensitive composition of the present invention, will be described below. Note that this compound in the present invention is also common to the compositions according to the first, second, and third embodiments.

An aminoplast resin is generally used as the compound having the substituent group capable of crosslinking the alkali-soluble resin. Examples of the aminoplast resin are melamine-formaldehyde resin, urea-formaldehyde resin, glycol-formaldehyde resin, and benzoguanamine-formaldehyde resin. These resins can be used singly or in a mixture of at least two resins. For example, Cymel Beetle series resins (manufactured by American Cyanamid Co.) is known as a commercially available aminoplast resin.

The content of the compound having the substituent group capable of crosslinking the alkali-soluble resin in the photosensitive composition of the present invention preferably falls within the range of 3 to 20 parts by weight based on 100 parts by weight of the alkali-soluble resin due to the following reasons. When the content of this compound is less than 3 parts by weight, the sensitivity of the composition is decreased. However, when the content exceeds 20 parts by weight, a resist residue tends to be left.

The photosensitive composition according to the first, second, or third embodiment of the present invention can be prepared such that the alkali-soluble resin, the compound which has a substituent group decomposable by an acid or capable of crosslinking the alkali-soluble resin in the presence of an acid, and the acid generator, i.e., a compound represented by formula (1), (2), or (3) are dissolved in an organic solvent and filtered. Examples of the organic solvent are ketone-series solvents (e.g., cyclohexanone, acetone, methyl ethyl ketone, and methyl isobutyl ketone), cellosolve-series solvents (e.g., methyl cellosolve, methyl cellosolve acetate, ethyl cellosolve acetate, and butyl cellosolve acetate), ester-series solvents (e.g., ethyl acetate, butyl acetate, isoamyl acetate, and γ-butyrolactone), dimethylsulfoxide, and dimethylformamide-N-methylpyrrolidone, These organic solvents may be used singly or in the form of a mixture containing at least two kinds. The organic solvent may contain an appropriate amounts of xylene, toluene, or an aliphatic alcohol such as isopropyl alcohol.

In addition, in the photosensitive composition according to the present invention, if necessaary, a surfactant or another polymer (e.g., an epoxy resin, polymethylmethacrylate, polymethylacrylate, propylene oxide-ethylene oxide copolymer, or polystyrene) may be added as a film modifier, or a dye may be mixed as an anti-reflection agent.

A process for forming a resist pattern using the photosensitive composition according to the first, second, or third embodiment of the present invention will be described below.

First, the photosensitive composition (varnish) prepared by dissolving the above components in the organic solvent is applied to a substrate by spin coating or dipping, and dried at a temperature of 150° C. or less, and preferably about 70° to 120° C., thereby forming a resist film. Examples of the substrate used herein is a silicon wafer, a silicon wafer having various insulating films, electrodes, and wiring layers thereon, a blank mask, and a III–V group compound semiconductor wafer such as GaAs and AlGaAs wafers.

Next, the resist film is selectively exposed to light through a predetermined mask pattern. An ultraviolet radiation is generally used in this exposure step. Alternatively, an ultraviolet ray having a short wavelength, X-ray, light emitted from a low-pressure mercury lamp, KrF or ArF excimer laser, synchrotron orbital radiation (SOR), electron beam, γ-ray, ion beam or the like may be used.

The resist film, thus selectively exposed, is heated (baked) at a temperature of 150° C. or less on a hotplate, in an oven, or by means of irradiation with an infrared radiation. Subsequently, the baked resist film is developed to form a desired pattern in accordance with dipping or spraying method using an alkaline solution or organic solvent. Examples of the alkaline solution are organic alkaline solutions (e.g., an aqueous solution of tetramethylammoniumhydroxide solution and an aqueous choline solution) and inorganic alkaline solutions (e.g., potassium hydroxide and sodium hydroxide). Such an alkaline solution is generally used at a concentration of 15 parts by weight. After the development, the resist film (pattern) may be subjected to rising using water or the like.

The photosensitive composition according to any one of the first, second, and third embodiments of the present invention exhibit different behaviors in accordance with the kind of compounds contained therein.

When the photosensitive composition of the present invention contains a dissolution inhibitor (i.e., a compound having a substituent group decomposable by an acid), an acid is generated from the acid generator upon exposure, i.e., upon exposure to radiation of an ultraviolet ray or an electron beam. When the composition is baked, the compound having the substituent group decomposable by the acid is decomposed to be converted into a compound having an alkali-soluble group by a behavior of an acid generated. As a result, in an exposed portion of the photosensitive composition, a dissolution inhibition function inherent to the dissolution inhibitor for the alkali-soluble resin is lost, and the solubility in the alkali solution is increased. That is, in this case, the photosensitive composition serves as a positive resist material in which only the exposed portion of the photosensitive composition is dissolved in the alkaline developing solution and selectively removed.

On the other hand, when the photosensitive composition of the present invention contains a compound containing a substituent group capable of crosslinking the alkali-soluble resin in the presence of an acid, an acid is generated from the acid generator upon exposure, and, by a baking treatment, an alkali-soluble resin is cross-linked with the above compound containing the substituent group by a behavior the acid. As a result, the exposed portion of the photosensitive composition becomes insoluble in the alkali solution with an increase in molecular weight of the alkali-soluble resin. That is, in this case, the photosensitive composition serves as a negative resist material in which only the exposed portion of the photosensitive composition is dissolved in the alkaline developing solution and selectively left.

The photosensitive composition having the above functions contain sulfonyl compound represented by formula (1), (2), or (3) as the acid generator. The acid generated by each of these sulfonyl compounds upon exposure rarely lose their activities until baking (heat treatment) after exposure is completed. Therefore, the photosensitive composition of the present invention is very stable throughout the resist pattern formation process and has excellent characteristics such as a high sensitivity and a high resolution. In particular, when the photosensitive composition of the present invention serves as a positive resist material, an unnecessary cross-linking reaction during baking after exposure can be reduced by using the sulfonyl compound represented by formula (1), (2), or (3) as the acid generator. Therefore, the alkali solubility of the exposed portion is improved, a decrease in sensitivity can be prevented, and a high resolution can be obtained.

Accordingly, a resist film is formed by applying the photosensitive composition according to any one of the fist, second, and third of the present invention and is subjected to exposure, baking, and alkali development, thereby forming a fine resist having a high resolution and a good pattern profile. In addition, when the resist pattern is used as a mask to dry-etch a substrate or the like, very accurate transfer etching can also be performed.

The present invention will be described in more detail by way of its examples. These examples will be described to readily understand the present invention and do not limit the scope of the present invention.

Preparation of Photosensitive Composition

Photosensitive compositions (Examples 1 to 40) according to the present invention were prepared following the formulations in Table 1. That is, components constituting each composition were dissolved in ethyl cellosolve acetate, and the resultant solution was filtered through a Teflon filter having a pore diameter of 0.1 μm to prepare each photosensitive composition.

Components used (components represented by symbols in Table 1) are defined as follows:

(1) Acid Generator

The following compounds A to O were used.

A: phenylsulfonylacetonitrile
B: p-toluenesulfonylacetonitrile
C: methanesulfonylacetonitrile
D: phenylsulfonylacetophenone
E: methylsulfonylacetophenone
F: methylated phenysulfonylnitromethane represented by formula given below

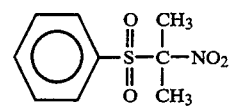

G: 1-methyl-2-((phenylsulfonyl)methyl)benzene
H: phenylsulfonyltetrahydropyran
I: bis(phenylsulfonyl)methane
J: tris(phenylsulfonyl)methane
K: phenylmercapto-bis(methylsulfonyl)-methane
L: bis(methylsulfnyl)-phenylsulfonyl-methane
M: bis(phenylsulfonyl)-methylsulfonyl-methane
N: bis(phenylsulfonyl)-(4-nitrophenylsulfonyl)methane
O: tris(methysulfonyl)methane Of these compounds, compounds A to E and G to I are commercially available products (available from Aldrich Chemical Co., Inc.), compound F is synthesized in accordance with a method described in J. Org. Chem. 46,765 (1981), and compounds J to are synthesized in accordance with a method described in Chem. Phar. Bull. 19(12), 2472 (1971). Compounds A to C, F, and G correspond to compounds represented by formula (1), compounds D, E, H, and I correspond to compounds represented by formula (2), and compounds J to O correspond to compounds represented by formula (3).

(2) Alkali-Soluble Resin

The following compounds were used.

PVP: polyvinylphenol (average molecular weight: 6,000 available from Maruzen Sekiyu Kagaku Kabushiki Kaisha)

NV: novolak resin (average molecular weight: 4,000; 3,5-xylesole:m-cresol:p-cresol=30:45:25)

(3) Compound Having Substituent Group Decomposable by Acid (Dissoluting Inhibitor) and Compound Having Substituent Group Capable of Crosslinking Alkali-Soluble Resin in the presence of Acid The following compounds a to d were used.

a:

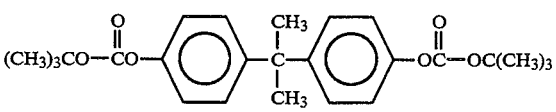

b:

-continued

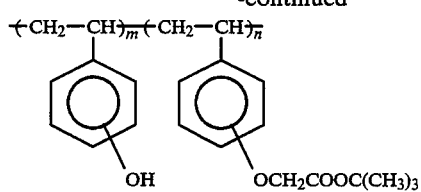

c:

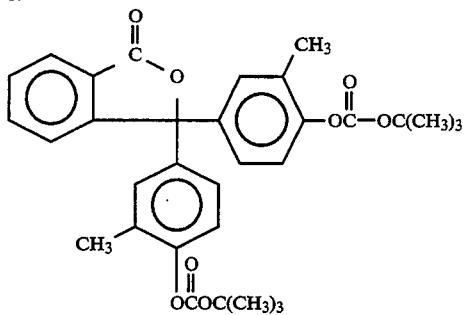

d:
Simel 325 (available from Mitsui Petrochemical Industries, Ltd.)

Compounds a to c correspond compounds each having a substituent group decomposable by an acid, and compound d corresponds to a compound having a substituent group capable of crosslinking the alkali-soluble resin.

TABLE 1

(Formulation of Photosensitive Composition)

| Example | Alkali-Soluble Resin (wt %) | Acid Generator (wt %) | Compound Having Substituent Group(*) (wt %) n: weigh ratio in b m + n = 100 |
|---|---|---|---|
| 1 | PVP (72) | A (3) | a (25) |
| 2 | PVP (72) | A (3) | b (25) n = 30 |
| 3 | PVP (70) | A (5) | a (25) |
| 4 | PVP (70) | A (5) | c (25) |
| 5 | PVP (85) | A (5) | d (10) |
| 6 | NV (70) | A (5) | b (25) n = 30 |
| 7 | NV (70) | A (5) | c (25) |
| 8 | NV (85) | A (5) | d (10) |
| 9 | None | A (5) | b (95) n = 10 |
| 10 | PVP (65) | B (10) | b (25) n = 30 |
| 11 | PVP (80) | B (10) | d (10) |
| 12 | PVP (65) | C (10) | b (25) n = 30 |
| 13 | PVP (65) | C (10) | c (25) |
| 14 | PVP (52.8) | D (5.2) | b (26) + c (16) n = 30 |
| 15 | PVP (54) | E (4) | b (26) + c (16) n = 30 |
| 16 | PVP (53) | E (5) | b (26) + c (16) n = 30 |
| 17 | PVP (65) | G (10) | a (25) |
| 18 | PVP (65) | G (10) | b (25) n = 30 |
| 19 | PVP (65) | G (10) | c (25) |
| 20 | NV (80) | G (10) | d (10) |
| 21 | NV (65) | G (10) | b (25) n = 30 |
| 22 | None | G (10) | b (90) n = 10 |
| 23 | PVP (65) | H (10) | a (25) |
| 24 | PVP (65) | H (10) | b (25) n = 30 |
| 25 | PVP (65) | I (5) | b (30) n = 30 |
| 26 | PVP (70) | I (5) | c (25) |
| 27 | PVP (85) | I (5) | d (10) |
| 28 | NV (85) | I (5) | d (10) |
| 29 | NV (70) | I (5) | b (25) n = 30 |
| 30 | None | I (5) | b (95) n = 10 |
| 31 | PVP (65) | J (5) | b (30) n = 30 |
| 32 | PVP (70) | J (5) | c (25) |
| 33 | NV (70) | J (5) | c (25) |
| 34 | PVP (65) | K (5) | b (30) n = 30 |
| 35 | PVP (65) | L (5) | b (30) n = 30 |
| 36 | PVP (65) | M (5) | b (30) n = 30 |
| 37 | PVP (70) | M (5) | c (25) |
| 38 | NV (70) | M (5) | c (25) |

TABLE 1-continued (Formulation of Photosensitive Composition)

| Example | Alkali-Soluble Resin (wt %) | Acid Generator (wt %) | Compound Having Substituent Group(*) (wt %) n: weigh ratio in b m + n = 100 |
|---|---|---|---|
| 39 | PVP (65) | N (5) | b (30) n = 30 |
| 40 | PVP (65) | O (5) | b (30) n = 30 |

Substituent Group(*): A group decomposable by an acid, or a group capable of crosslinking the alkali-soluble resin in the presence of an acid Evaluation of Resolution of Resist Pattern Resist patterns of the photosensitive compositions according to Examples 1 to 40 were formed as follows.

A silicon wafer was coated with each photosensitive composition by a spinner and the wafer was dried at 100° C. for 5 minutes to form a resist film having a thickness of 1.0 μm thereon. Then the resultant resist film was exposed to light by a reduction projection aligner using an electron beam, a KrF excimer laser light (248 mm) or SOR. Note that the acceleration voltage of an electron beam was set to be 20 keV. Each resist film which had been exposed was baked on a hot plate at 110° C. for 2 minutes and developed in a 1.19 wt % aqueous solution tetramethylammoniumhydroxide for 2 to 7 minutes, thereby forming each resist pattern. Note that exposure to an KrF excimer laser light was not performed on the compositions according to Examples 12 and 13 and exposure to SOR was performed on each of the compositions according to Examples 1, 25 and 31.

The resolutions of the resist patterns which had been formed by using the compositions according to Examples 1 to 40 at an optimal exposure were evaluated by observing the sectional shapes with SEM. The results of sensitivities, resolutions, and pattern sectional shapes of the photosensitive compositions according to all the examples upon exposure to an electron beam are summarized in Table 2, those upon exposure to a KrF excimer laser light are summarized in Table 3 and those upon exposure to SOR are summarized in Table 4.

TABLE 2

(Evaluation of Photosensitive Composition in the case of Employing Exposure to Electron Beam)

| Example | Sensitivity (μC/cm²) | Resolution (μm) | Sectional Shape of Pattern *: positive unless otherwise specified |
|---|---|---|---|
| 1 | 5 | 0.25 |  |
| 2 | 5 | 0.25 |  |
| 3 | 3.5 | 0.25 |  |
| 4 | 3.5 | 0.2 |  |
| 5 | 3 | 0.2 |  (negative) |
| 6 | 7 | 0.25 |  |

TABLE 2-continued (Evaluation of Photosensitive Composition in the case of Employing Exposure to Electron Beam)

| Example | Sensitivity (μC/cm²) | Resolution (μm) | Sectional Shape of Pattern *: positive unless otherwise specified |
|---|---|---|---|
| 7 | 7 | 0.25 |  |
| 8 | 5 | 0.25 |  (negative) |
| 9 | 5 | 0.2 |  |
| 10 | 50 | 0.35 |  |
| 11 | 35 | 0.3 |  (negative) |
| 12 | 75 | 0.35 |  |
| 13 | 40 | 0.35 |  |
| 14 | 25 | 0.2 |  |
| 15 | 60 | 0.3 |  |
| 16 | 20 | 0.2 |  |
| 17 | 8 | 0.30 |  |
| 18 | 7 | 0.25 |  |
| 19 | 6 | 0.25 |  |
| 20 | 3 | 0.25 |  (negative) |
| 21 | 10 | 0.25 |  |
| 22 | 5 | 0.20 |  |
| 23 | 7 | 0.20 |  |
| 24 | 5 | 0.25 |  |
| 25 | 6 | 0.20 |  |
| 26 | 6 | 0.20 |  |
| 27 | 2 | 0.20 |  (negative) |
| 28 | 0.5 | 0.25 |  (negative) |
| 29 | 8 | 0.20 |  |
| 30 | 5 | 0.20 |  |
| 31 | 5 | 0.20 |  |
| 32 | 5 | 0.20 |  |
| 33 | 7.5 | 0.25 |  |
| 34 | 15 | 0.30 |  |
| 35 | 10 | 0.25 |  |
| 36 | 7 | 0.20 |  |
| 37 | 7 | 0.20 |  |
| 38 | 10 | 0.25 |  |
| 39 | 5 | 0.20 |  |
| 40 | 30 | 0.35 |  |

TABLE 3

(Evaluation of Photosensitive Composition in the case of Employing Exposure to KrF Excimer Laser Light)

| Example | Sensitivity (mJ/cm²) | Resolution (μm) | Sectional Shape of Pattern *: positive unless otherwise specified |
|---|---|---|---|
| 1 | 50 | 0.35 |  |
| 2 | 50 | 0.35 |  |

TABLE 3-continued
(Evaluation of Photosensitive Composition in the case of Employing Exposure to KrF Excimer Laser Light)

| Example | Sensitivity (mJ/cm²) | Resolution (μm) | Sectional Shape of Pattern *: positive unless otherwise specified |
|---|---|---|---|
| 3 | 25 | 0.3 |  |
| 4 | 25 | 0.3 |  |
| 5 | 10 | 0.3 |  (negative) |
| 6 | 110 | 0.35 |  |
| 7 | 125 | 0.35 |  |
| 8 | 80 | 0.3 |  (negative) |
| 9 | 25 | 0.3 |  |
| 10 | 150 | 0.4 |  |
| 11 | 125 | 0.4 |  (negative) |
| 14 | 85 | 0.3 |  |
| 15 | 150 | 0.4 |  |
| 16 | 60 | 0.3 |  |
| 17 | 45 | 0.30 |  |
| 18 | 45 | 0.25 |  |
| 19 | 45 | 0.25 |  |
| 20 | 15 | 0.30 |  (negative) |
| 21 | 60 | 0.30 |  |
| 22 | 25 | 0.25 |  |
| 23 | 30 | 0.25 |  |
| 24 | 25 | 0.25 |  |
| 25 | 40 | 0.25 |  |
| 26 | 40 | 0.25 |  |
| 27 | 10 | 0.25 |  (negative) |
| 28 | 2 | 0.25 |  (negative) |
| 29 | 40 | 0.25 |  |
| 30 | 30 | 0.25 |  |
| 31 | 25 | 0.25 |  |
| 32 | 25 | 0.25 |  |
| 33 | 40 | 0.25 |  |
| 34 | 80 | 0.35 |  |
| 35 | 55 | 0.30 |  |
| 36 | 35 | 0.25 |  |
| 37 | 35 | 0.25 |  |
| 38 | 50 | 0.25 | |
| 39 | 25 | 0.20 | |

TABLE 4
(Evaluation of Photosensitive Composition in the case of Employing Exposure to SOR)

| Example | Sensitivity (mJ/cm²) | Resolution (μm) | Sectional Shape of Pattern *: positive unless otherwise specified |
|---|---|---|---|
| 1 | 350 | 0.20 |  |

TABLE 4-continued (Evaluation of Photosensitive Composition in the case of Employing Exposure to SOR)

| Example | Sensitivity (mJ/cm²) | Resolution (μm) | Sectional Shape of Pattern *: positive unless otherwise specified |
|---|---|---|---|
| 25 | 375 | 0.02 |  |
| 31 | 450 | 0.02 |  |

COMPARATIVE EXAMPLE

Poly-vinylphenol as an alkali-soluble resin, triphenyl-sulfoniumtrifluoromethanesulfonate (onium salt) as an acid generator, and the compound c as a compound having a substituent group decomposable by an acid were mixed at a weight ratio of 70:1:29 following the same procedures as in Examples 1 to 40 to prepare a photosensitive composition as a comparative example.

A wafer was coated with the above composition to form a resist film, and the film was exposed to an electron beam or a KrF excimer laser light and subjected to baking treatment following the same procedures as in Examples 1 to 40. Then, the baked film was subjected to development under predetermined conditions to obtain a resist pattern, and the resolution of the resist pattern was evaluated with SEM. Results are summarized in Table 5 below.

TABLE 5

(Evaluation of Photosensitive Composition according to Comparative Example)

| Radiation Source | Sensitivity | Resolution (μm) | Sectional Shape of Pattern |
|---|---|---|---|
| | (mJ/cm²) | | |
| KrF | 60 | 0.45 |  |
| | (μc/cm²) | | |
| Electron Beam | 10 | 0.40 |  |

Changes in sensitivities of the photosensitive compositions according Example 25 and the comparative example during a time interval from the end of exposure to the KrF excimer laser light to the start of baking were evaluated. Results are summarized in Table 6.

TABLE 6

(Change in Sensitivity of Photosensitive Composition from End of Exposure to Baking Treatment)

| | Time from End of Exposure to PEB (mJ/cm²) | | | | |
|---|---|---|---|---|---|
| | Immediately after exposure | After 30 minutes | After 1 hour | After 2 hour | After 8 hour |
| Comparative Example | 60 | 60 | 65 | 180 | not resolved |
| Example | 20 | 20 | 20 | 25 | 25 |

*PEB: Post Exposure Baking

The results in Tables 2 to 6 suggest that each photosensitive composition according to the present invention has a high sensitivity and a high resolution as a resist material, and is excellent in stability after exposure with respect to these properties.

What is claimed is:

1. A photosensitive composition comprising:
   an alkali-soluble resin;
   a compound which has a substituent group decomposable by an acid and generates an alkali-soluble group upon decomposition of the substituent group, or an aminoplast resin which has a substituent group capable of crosslinking the alkali-soluble resin in the presence of an acid; and
   a compound which generates an acid upon exposure, which is represented by formula (1) given below:

$$R_{11}-\overset{\overset{\displaystyle O}{\|}}{\underset{\underset{\displaystyle O}{\|}}{S}}-\overset{\overset{\displaystyle R_{12}}{|}}{\underset{\underset{\displaystyle R_{14}}{|}}{C}}-R_{13} \quad (1)$$

wherein $R_{11}$ represents a monovalent organic group, or a monovalent organic group into which at least one substituent selected from the group consisting of a halogen atom, a nitro group, and a cyano group is introduced, each of the $R_{12}$, $R_{13}$, and $R_{14}$ independently represents hydrogen, a halogen atom, a nitro group, a cyano group, a monovalent organic group, or a monovalent organic group into which at least one substituent selected from the group consisting of a halogen atom, a nitro group, and a cyano group is introduced.

2. The composition according to claim 1, wherein at least one of $R_{12}$, $R_{13}$, and $R_{14}$ in formula (1) is a cyano group.

3. The composition according to claim 1, wherein at least one of $R_{12}$, $R_{13}$, and $R_{14}$ in formula (1) is hydrogen.

4. The composition according to claim 1, wherein $R_{11}$ in formula (1) is an aromatic group.

5. The composition according to claim 1, wherein a content of the compound represented by formula (1) is at least about not less than 0.1 part by weight and less than about 40 parts by weight based on 100 parts by weight of a content of the alkali-soluble resin.

6. The composition according to claim 1, wherein the alkali-soluble resin is a phenolic novolak resin.

7. The composition according to claim 1, wherein the alkali-soluble resin has a softening point of not less than 150° C. and an average molecular weight of about 3,000 to 8,000.

8. The composition according to claim 1, wherein the compound having the substituent group decomposable by the acid is converted into a compound which generates —COO— or —SO₃— by a behavior of an alkaline solution after decomposition of the substituent group by the acid.

9. The composition according to claim 8, wherein the compound having the substituent group decomposable by the acid is a compound represented by formula (4) given below:

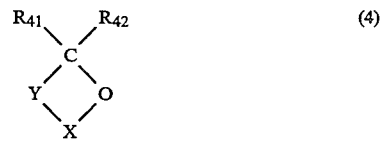

wherein R₄₁ and R₄₂ may be the same or different and each represents hydrogen, a halogen atom, a cyano group, a nitro group, a silyl group, or a monovalent organic group; R₄₁ and R₄₂ may be combined to form a ring; X represents >C=O or —SO₂—; Y represents a bivalent organic group; and at least one of R₄₁, R₄₂, and Y has the substituent group decomposable by the acid.

10. The composition according to claim 9, wherein a content of the compound represented by formula (4) falls within a range of about 3 to 40 parts by weight based on 100 parts by weight of a content of the alkali-soluble resin.

11. A photosensitive composition comprising:
an alkali-soluble resin;
a compound which has a substituent group decomposable by an acid and generates an alkali-soluble group upon decomposition of the substituent group, or an aminoplast resin which has a substituent group capable of crosslinking the alkali-soluble resin in the presence of an acid; and
a compound which generates an acid upon exposure, which is represented by formula (2) given below:

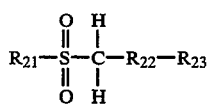

wherein each of R₂₁ and R₂₃ independently represents a monovalent organic group, or a monovalent organic group into which at least one substituent selected from the group consisting of a halogen atom, a nitro group, and a cyano group is introduced, and R₂₂ represents a sulfonyl or carbonyl group.

12. The composition according to claim 11, wherein at least one of R₂₁ and R₂₃ in formula (2) is an aromatic group.

13. The composition according to claim 11, wherein a content of the compound represented by formula (2) is at least about not less than 0.1 part by weight and less than about 40 parts by weight based on 100 parts by weight of a content of the alkali-soluble resin.

14. The composition according to claim 11, wherein the alkali-soluble resin is a phenolic novolak resin.

15. The composition according to claim 11, wherein the alkali-soluble resin has a softening point of not less than 150° C. and an average molecular weight of about 3,000 to 8,000.

16. The composition according to claim 11, wherein the compound having the substituent group decomposable by the acid is converted into a compound which generates —COO— or —SO₃— by a behavior of an alkaline solution after decomposition of the substituent group by the acid.

17. The composition according to claim 16, wherein the compound having the substituent group decomposable by the acid is a compound represented by formula (4) given below:

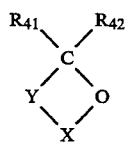

wherein R₄₁ and R₄₂ may be the same or different and each represents hydrogen, a halogen atom, a cyano group, a nitro group, a silyl group, or a monovalent organic group; R₄₁ and R₄₂ may be combined to form a ring; X represents >C=O or —SO₂—; Y represents a bivalent organic group; and at least one of R₄₁, R₄₂, and Y has the substituent group decomposable by the acid.

18. The composition according to claim 17, wherein a content of the compound represented by formula (4) falls within a range of about 3 to 40 parts by weight based on 100 parts by weight of a content of the alkali-soluble resin.

19. A photosensitive composition comprising:
an alkali-soluble resin;
a compound which has a substituent group decomposable by an acid and generates an alkali-soluble group upon decomposition of the substituent group; and
a compound which generates an acid upon exposure, which is represented by formula (3) given below:

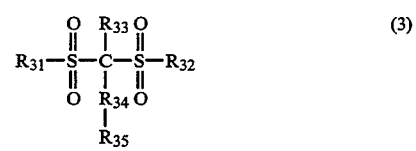

wherein each of R₃₁, R₃₂, and R₃₅ independently represents a monovalent organic group, or a monovalent organic group into which at least one substituent selected from the group consisting of a halogen atom, a nitro group, and a cyano group is introduced, R₃₃ represents hydrogen, a monovalent organic group, or a monovalent organic group into which at least one substituent selected from the group consisting of a halogen atom, a nitro group, and a cyano group is introduced, and R₃₄ represents a sulfonyl group, a sulfinyl group, a sulfur atom, or a carbonyl group.

20. The composition according to claim 19, wherein R₃₄ in formula (3) is a sulfonyl group.

21. The composition according to claim 19, wherein at least one of R₃₁, R₃₂, and R₃₅ is an aromatic group.

22. The composition according to claim 19, wherein a content of the compound represented by formula (3) is at least about not less than 0.1 part by weight and less than about 40 parts by weight based on 100 parts by weight of a content of the alkali-soluble resin.

23. The composition according to claim 19, wherein the alkali-soluble resin is a phenolic novolak resin.

24. A composition according to claim 19, wherein the alkali-soluble resin has a softening point of not less than 150° C. and an average molecular weight of about 3,000 to 8,000.

25. The composition according to claim 19, wherein the compound having the substituent group decomposable by the acid is converted into a compound which generates —COO— or —SO₃— by a behavior of an alkaline solution after decomposition of the substituent group by the acid.

26. The composition according to claim 25, wherein the compound having the substituent group decomposable by the acid is a compound represented by formula (4) given below:

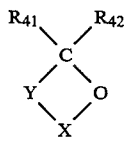 (4)

wherein $R_{41}$ and $R_{42}$ may be the same or different and each represents hydrogen, a halogen atom, a cyano group, a nitro group, a silyl group, or a monovalent organic group; $R_{41}$ and $R_{42}$ may be combined to form a ring; X represents $>C=O$ or $-SO_2-$; Y represents a bivalent organic group; and at least one of $R_{41}$, $R_{42}$, and Y has the substituent group decomposable by the acid.

27. The composition according to claim 26, wherein a content of the compound represented by formula (4) falls within a range of about 3 to 40 parts by weight based on 100 parts by weight of a content of the alkali-soluble resin.

28. A composition containing 0 to 30 parts by weight of poly-vinylphenol, 30 to 100 parts by weight of poly-vinylphenol partially protected by tert-butyl acetate, and 1 to 30 parts by weight of phenylsulfonylacetonitrile.

29. A photosensitive composition, comprising:
an alkali-soluble resin;
a dissolution inhibitor which has a substituent group decomposable by an acid and generates an alkali-soluble group upon decomposition of the substituent group, or an aminoplast resin which is capable of crosslinking the alkali-soluble resin in the presence of an acid; and
a compound which generates an acid upon exposure, which is selected from the group consisting of the compounds represented by formulas (1) and (3) given below:

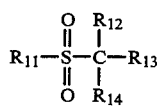 (1)

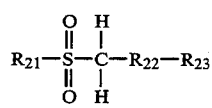 (2)

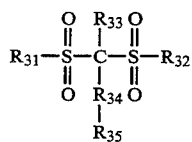 (3)

wherein $R_{11}$ represents a monovalent organic group, or a monovalent organic group into which at least one substituent selected from the group consisting of a halogen atom, a nitro group, and a cyano group is introduced, each of $R_{12}$, $R_{13}$, and $R_{14}$ independently represents hydrogen, a halogen atom, a nitro group, a cyano group, a monovalent organic group, or a monovalent organic group into which at least one substituent selected from the group consisting of a halogen atom, a nitro group, and a cyano group is introduced, each of $R_{21}$ and $R_{23}$ independently represents a monovalent organic group, or a monovalent organic group into which at least one substituent selected from the group consisting of a halogen atom, a nitro group, and a cyano group is introduced, $R_{22}$ represents a sulfonyl or carbonyl group, each of $R_{31}$, $R_{32}$, and $R_{35}$ independently represents a monovalent organic group, or a monovalent organic group into which at least one substituent selected from the group consisting of a halogen atom, a nitro group, and a cyano group is introduced, $R_{33}$ represents hydrogen, a monovalent organic group, or a monovalent organic group into which at least one substituent selected from the group consisting of a halogen atom, a nitro group, and a cyano group is introduced, and $R_{34}$ represents a sulfonyl group, a sulfinyl group, a sulfur atom, and a carbonyl group, and wherein the solubility of said composition in an alkali solution is changed when exposed to radiation.

30. The composition of claim 29, wherein said composition contains a polyimide precursor.

31. The composition of claim 29, wherein said composition contains an epoxy resin.

32. A pattern formation process, comprising the steps of:
coating a substrate with a solution of the photosensitive composition according to any one of claims 1, 11 or 19 to form a resist film, wherein the composition of claim 19 may contain the aminoplast resin which has a substituent group capable of crosslinking the alkali-soluble resin in the presence of an acid instead of said compound which has a substituent group decomposable by an acid and generates an alkali-soluble group upon decomposition of the substituent group;
pattern-exposing said resist film to radiation;
baking the resist film after exposure to the radiation; and
developing the resist film after the baking step.

* * * * *